(12) United States Patent
Collantes, Jr. et al.

(10) Patent No.: US 7,416,419 B2
(45) Date of Patent: Aug. 26, 2008

(54) METHODS FOR ESD PROTECTION

(75) Inventors: Patricio Collantes, Jr., San Jose, CA (US); Robert C. Miller, San Jose, CA (US); Steven T. Sprouse, San Jose, CA (US); Dhaval Parikh, Santa Clara, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 11/465,049

(22) Filed: Aug. 16, 2006

(65) Prior Publication Data
US 2008/0045049 A1    Feb. 21, 2008

(51) Int. Cl.
*H01R 12/00* (2006.01)
(52) U.S. Cl. .................................... 439/76.1
(58) Field of Classification Search ............... 439/76.1, 439/141, 142, 135–136, 131, 607, 95, 518, 439/638, 140; 713/194; 361/115, 737; 710/74, 710/62, 72–73; 235/435
See application file for complete search history.

(56) References Cited

U.S. PATENT DOCUMENTS

| 5,627,729 | A | 5/1997 | Oldendorf et al. | |
|---|---|---|---|---|
| 5,887,145 | A | 3/1999 | Harari et al. | |
| 6,385,677 | B1 | 5/2002 | Yao | |
| 6,513,720 | B1 | 2/2003 | Armstrong | |
| 6,561,421 | B1 | 5/2003 | Yu | |
| 6,722,924 | B1 | 4/2004 | Zhou et al. | 439/608 |
| 6,733,329 | B2 | 5/2004 | Yang | |
| 6,792,487 | B2 * | 9/2004 | Kao | 710/74 |
| 6,808,400 | B2 * | 10/2004 | Tu | 439/131 |
| 6,890,188 | B1 | 5/2005 | Le | |
| 7,118,414 | B2 | 10/2006 | Spears et al. | 439/540.1 |
| 7,153,148 | B2 * | 12/2006 | Chen et al. | 439/141 |
| 7,252,518 | B1 | 8/2007 | Ni | |
| 2001/0036524 | A1 | 11/2001 | Anderson | |
| 2003/0028797 | A1 * | 2/2003 | Long et al. | 713/194 |
| 2003/0212848 | A1 | 11/2003 | Liu et al. | |
| 2004/0040871 | A1 | 3/2004 | Kakinoki et al. | |
| 2005/0139683 | A1 | 6/2005 | Yi | |
| 2005/0181645 | A1 | 8/2005 | Ni et al. | 439/79 |
| 2005/0230484 | A1 | 10/2005 | Cuellar et al. | |
| 2006/0038023 | A1 | 2/2006 | Brewer et al. | |
| 2006/0192004 | A1 | 8/2006 | Elazar et al. | |
| 2007/0015407 | A1 | 1/2007 | Loftus | 439/607 |
| 2007/0184685 | A1 | 8/2007 | Hsueh et al. | 439/76.1 |

FOREIGN PATENT DOCUMENTS

JP        2003-54676       2/2003

OTHER PUBLICATIONS

USPTO, "Office Action" mailed in U.S. Appl. No. 11/465,045 on Aug. 23, 2007, 10 pages.
Patricio Collantes, Jr. et al., "Connector With ESD Protection," U.S. Appl. No. 11/465,045, filed Aug. 16, 2006, 13 pages.
Office Action dated Mar. 14, 2008, U.S. Appl. No. 11/465,405, filed Aug. 16, 2006.
Universal Serial Bus Specification Revision 2.0, Chapter 6—Mechanical, p. 85-118, no date.

* cited by examiner

*Primary Examiner*—Edwin A. León
(74) *Attorney, Agent, or Firm*—Vierra Magen Marcus & DiNiro LLP

(57) ABSTRACT

A Universal Serial Bus flash memory unit having an electrically conductive housing includes a spring that provides an electrically conductive, low-resistance pathway between the housing and the metal shell of the Universal Serial Bus connector so that electrostatic charge can directly discharge from the housing to the metal shell instead of discharging through electronic components within the housing.

10 Claims, 3 Drawing Sheets

METHODS FOR ESD PROTECTION

CROSS-REFERENCE TO RELATED APPLICATION

This application is related to U.S. patent application Ser. No. 11/465,045, entitled, "Connector with ESD Protection", filed on the same day as the present application; which application is incorporated in its entirety by reference as if filly set forth herein.

BACKGROUND AND SUMMARY

This invention relates generally to the use and structure of removable nonvolatile memory devices, particularly those having standardized connectors for interfacing with other electronic systems.

Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and TransFlash™ memory module standards.

Small, hand-held re-programmable non-volatile memories have also been made to interface with a computer or other type of host through a Universal Serial Bus (USB) connector. These are especially convenient for users who have one or more USB connectors available on the front of their personal computers, particularly if a receptacle slot for one of the above identified memory cards is not present. Such devices are also very useful for transferring data between various host systems that have USB receptacles, including portable devices. Mechanical and electrical details of the USB interface are provided by the "Universal Serial Bus Specification," revision 2.0, dated Apr. 27, 2000. USB connectors generally feature a metal shell surrounding an opening that contains pins, the metal shell connecting to ground when inserted into a USB receptacle. There are several USB flash drive products commercially available from SanDisk Corporation under its trademark "Cruzer®." USB flash drives are typically larger and shaped differently than the memory cards described above.

Removable memory units (cards, USB flash drives and other units) are generally provided with a standardized connector. In some cases, such connectors are susceptible to damage. A cap may be used to cover such a connector so that it is protected. However, where such covers are separable from the memory unit, they may be lost or damaged easily. One alternative is to provide a connector that retracts into the housing of the memory unit for protection. Examples of such units include Cruzer® Titanium USB flash drives from SanDisk Corporation. In order to provide physical protection, the housing of a flash drive may be made of a metal, such as steel, stainless steel, aluminum, titanium, zinc, a suitable alloy or any other suitable metal.

A unit with a retractable connector generally has a feature on the outside of its housing that allows a user to manually slide the connector between a retracted position and an extended position. In the retracted position, the connector is contained within the housing and is protected by the housing. In the extended position, the connector extends through an opening in the housing so that it may be plugged into a receptacle. Such an opening is generally made somewhat larger than the connector so that there is some clearance around the connector to allow it to freely extend and retract without significant friction or binding.

Under normal circumstances, some electrostatic charge can develop on the conductive housing which may lead to Electrostatic Discharge (ESD) issues. ESD is a discharge of transient charge that may develop on a conductive housing or on a body that is in electrical contact with the housing, causing the housing to be at higher electrical potential with respect to ground requiring a ground path to discharge. Hence many electrical/electronic systems are furnished with ESD protection circuits. These circuits prevent an unwanted transient charge that may develop on a conductive housing from jumping onto sensitive components within the memory system and hence prevent the damage or failure of memory devices. One way to design for ESD protection is to provide a ground path to chassis (PC) ground via a metal shell of a connector.

A conductive spring provided between the connector and the housing provides an electrically conductive pathway between the housing and the metal shell of the connector. Thus, the housing and the metal shell are kept at the same potential. When the connector is connected to a receptacle, the metal shell is connected to ground and any charge on the housing is discharged through the conductive spring to the conductive shell. In this way, the memory system is protected from damaging electrostatic discharge. In one example, the conductive spring is formed integrally with the metal shell of the connector.

Additional aspects, advantages, features and details of various aspects of the present invention are included in the following description of exemplary embodiments thereof, which description should be taken in conjunction with the accompanying drawings.

All patents, patent applications, articles, manuals, standards, specifications, other publications and things referenced herein are hereby incorporated herein by those references in their entirety for all purposes.

DETAILED DESCRIPTION OF ILLUSTRATED EMBODIMENTS

Figure 1:
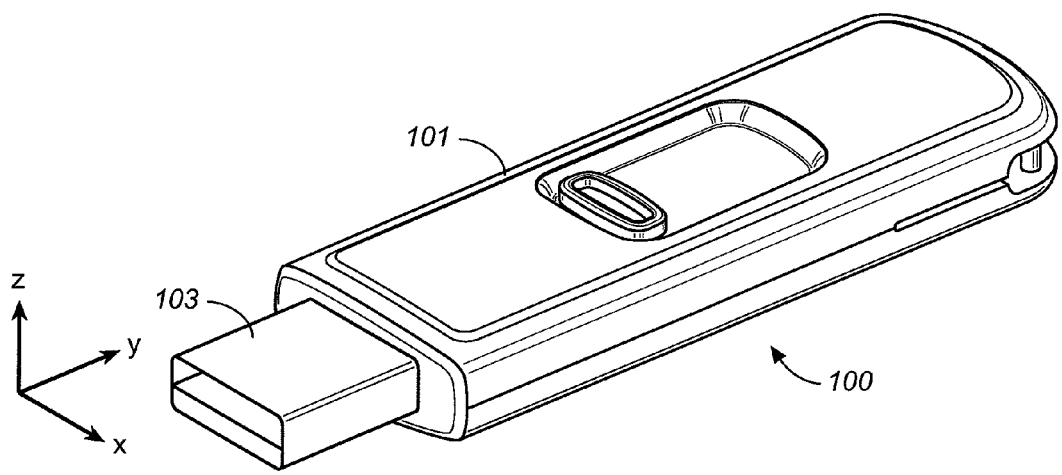
FIG. 1 shows a removable flash memory unit having a retractable USB connector according to an embodiment of the present invention.

FIG. 1 shows an example of a removable flash memory unit (flash drive) 100 that has a retractable USB connector 103 extending from a housing 101. Housing 101 is made of a conductive metal in the present example (for example, a Copper alloy or steel). Housing 101 consists of a metal top lid and a metal bottom lid joined together. Other configurations are also possible and a housing may be considered to be conductive even where it includes some insulating components. An opening in housing 101 allows connector 103 to extend from housing 101 so that it can plug into a receptacle. Suitable receptacles according to the USB standard are generally provided on personal computers and other devices.

Figure 2:
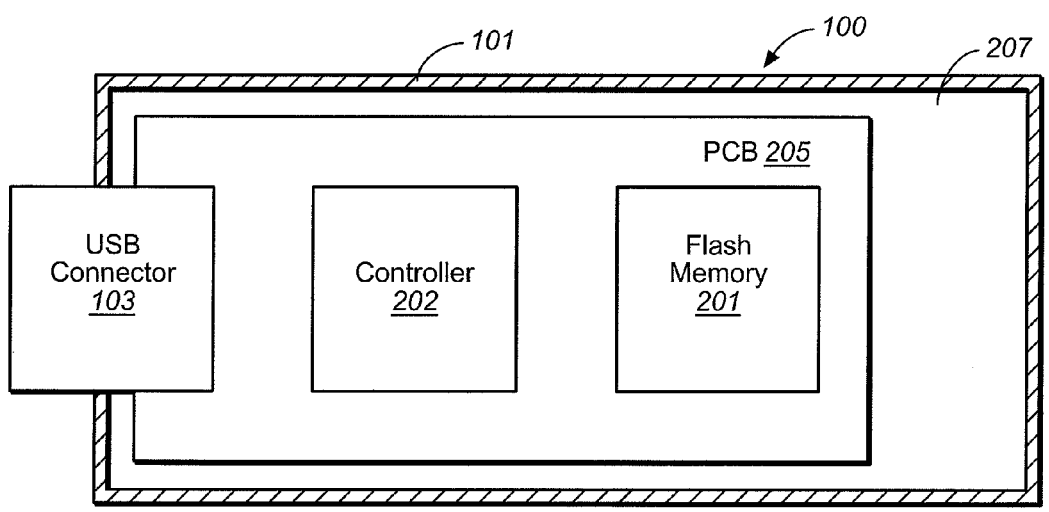
FIG. 2 shows a cross sectional view of the removable flash memory unit of FIG. 1 including a slidable PCB to which the connector is mounted.

FIG. 2 shows a cross sectional view of removable flash memory unit 100 along the X-Y plane of FIG. 1. USB connector 103 is mounted to a Printed Circuit Board (PCB) 205 at one end. Also mounted to PCB 205 are a controller 202 and a memory 201. Controller 202 and memory 201 form a memory system in the present example. In some cases additional components may be mounted to PCB 205 as part of a memory system. USB connector 103 is connected to controller 202 by electrical conductors (not shown) and controller 202 and flash memory 201 are also connected. FIG. 2 shows a volume 207 within housing 101 into which PCB 205 may slide. When PCB 205 slides back to occupy volume 207, connector 103 slides with it so that connector 103 retracts into housing 101.

Figure 3A:
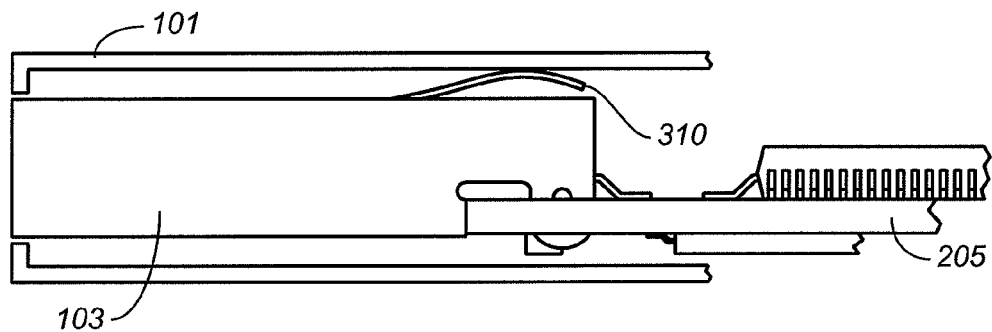
FIG. 3A shows a cross section of the removable flash memory unit of FIG. 1 from the side, with the connector in the retracted position, including an electrically conductive spring extending from the connector.

FIG. 3A shows a vertical cross section (along a plane perpendicular to the x-axis of FIG. 1) of a portion of removable flash memory unit 100. Unlike FIGS. 1 and 2, FIG. 3A shows connector 103 in a retracted position within housing 101. FIG. 3A shows a spring 310 extending from connector 103 to contact housing 101. Spring 310 is formed of a conductive metal in this example so that an electrically conductive pathway is formed between connector 103 and housing 101, this electrically conductive pathway providing desirable ESD protection. In other examples, a conductive spring may have a different configuration, for example extending from the bottom or sides of a connector, or extending from the housing. In the present example, spring 310 contacts housing 101 when connector 103 is in the retracted position, though in other examples a spring may only make contact with a housing when in the extended position.

Figure 3B:
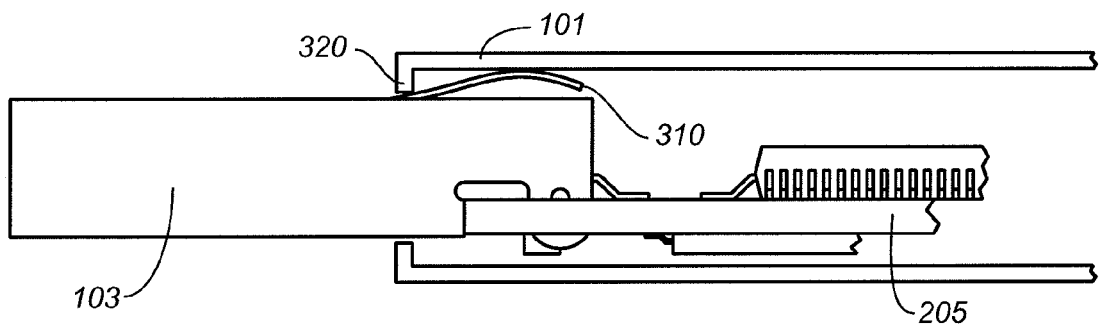
FIG. 3B shows a cross section of the removable flash memory unit of FIG. 3A with the connector in the extended position.

FIG. 3B shows a portion of flash memory unit 100 in the same view as FIG. 3A, but with connector 103 in the extended position where it protrudes from housing 101. Spring 310 is shown contacting housing 101 along edge 320. As connector 103 slides forward, spring 310 may be depressed by edge 320 and deformed. Spring 310 deforms elastically so that when connector 103 is returned to its retracted state, spring 310 returns to its previous position. As spring 310 deforms it presses against edge 320 to form a low-resistance, metal-to-metal contact with housing 101. Thus, in the extended position, connector 103 is connected to housing 101 by an electrically conductive, low-resistance pathway. Also, in the retracted position and at all positions between extended and retracted positions, spring 310 maintains a connection between connector 103 and housing 101. This provides a pathway for electrostatic discharge that has a lower resistance than a pathway through electronic components within housing 101. Any static charge that may have built up on housing 101 is discharged directly from housing 101 to connector 103 when connector 103 is inserted in a receptacle. When flash memory unit 100 is in use, with connector 103 in a receptacle, the metal shell of connector 103 is connected to chassis ground. Thus, if a person who has an electrostatic charge on their body touches housing 101, the electrostatic charge discharges from housing 101 to connector 103 without passing through electronic components within housing 101. Spring 310 provides an alternative route for electrostatic discharge so that instead of discharging through components within housing 101, current passes directly to connector 103 by a low-resistance pathway. In the present example, spring 310 maintains an electrically conductive, low-resistance pathway at all times, when connector 103 is in the extended position, in the retracted position and at all intermediate positions.

In the example illustrated, connector 103 is mounted to PCB 205 so that connector 103 is not separately movable from PCB 205. However, in other embodiments, USB connector may be moved independently of some or all the components of the memory system and may not always be mounted to a PCB. The present invention is not limited to connectors that are mounted to a PCB.

A spring may be provided on either housing 101 or on connector 103. Alternatively, an additional structure may be added that includes a spring to provide a conductive pathway. For a USB connector, the metal shell of the connector generally provides a pathway to ground when the connector is connected to a receptacle. This metal shell is generally formed of a sheet of metal that wraps around a central opening that contains pins for data transmission. In the present example, spring 310 is formed integrally with the metal shell of connector 103. That is, spring 310 is formed from the same metal sheet that forms the metal shell of connector 103.

Figure 4A:
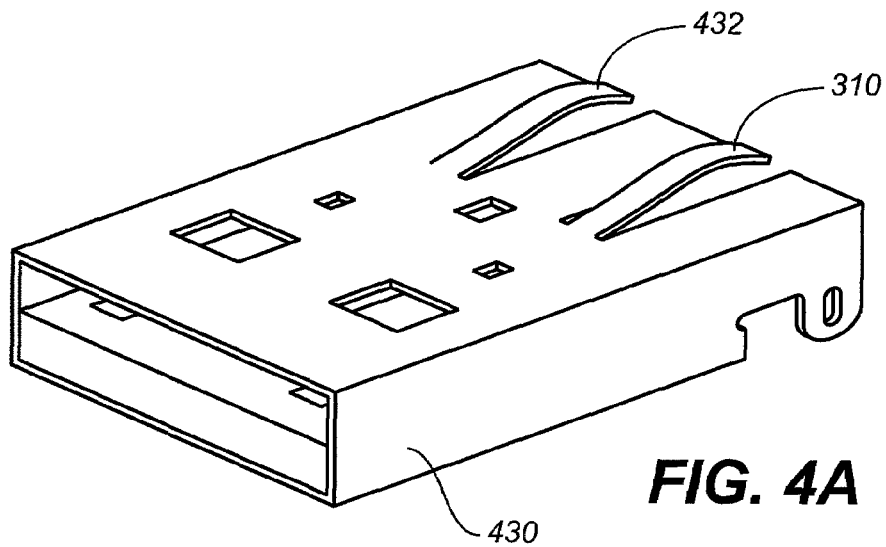
FIG. 4A shows the metal shell of the USB connector of FIG. 1 including two springs.

FIG. 4A shows metal shell 430 of connector 103 prior to installation in housing 101. FIG. 4A shows spring 310 and spring 432 extending from metal shell 430 (spring 432 is not visible in earlier figures). Spring 310 and spring 432 both serve the same purpose. Different numbers of springs may be used in different examples. In some cases, one spring may be sufficient while in other cases, two, three or more springs may be used. Springs may be located on any side of metal shell 430. FIG. 4A shows spring 310 formed from metal shell 430. Spring 310 is a strip of metal from metal shell 430 that is elongated longitudinally (along the Y-direction of FIG. 1). Spring 310 remains attached to the remainder of metal shell 430 at one end. The other end is bent up from metal shell 430 so that it extends above the upper surface of metal shell 430. Thus, even where an opening in a housing provides clearance for a standard sized connector, spring 310 extends sufficiently to bridge the gap and maintain an electrically conductive pathway. Spring 310 deforms elastically so that it maintains good contact with housing 101 throughout repeated operation, and does not interfere with movement of connector 103. A spring may be formed in any suitable shape and may be straight or curved. Forming a spring integrally with a metal shell of a connector provides a simple, reliable structure that creates an electrically conductive, low-resistance pathway between the connector and the housing.

Figure 4B:
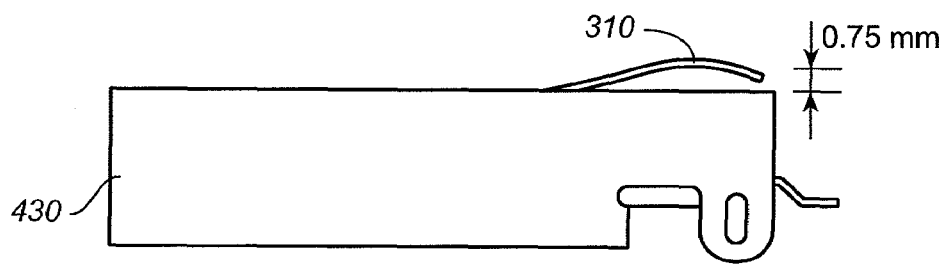
FIG. 4B shows a side view of the metal shell of FIG. 4A.

FIG. 4B shows a side view of metal shell 430. Spring 310 is shown extending 0.75 mm above the upper surface of metal shell 430. This extends sufficiently to bridge the gap between metal shell 430 and housing 101. However, a spring may be formed to extend a different amount for a different housing and the dimensions of the present figures are exemplary only.

Figure 4C:
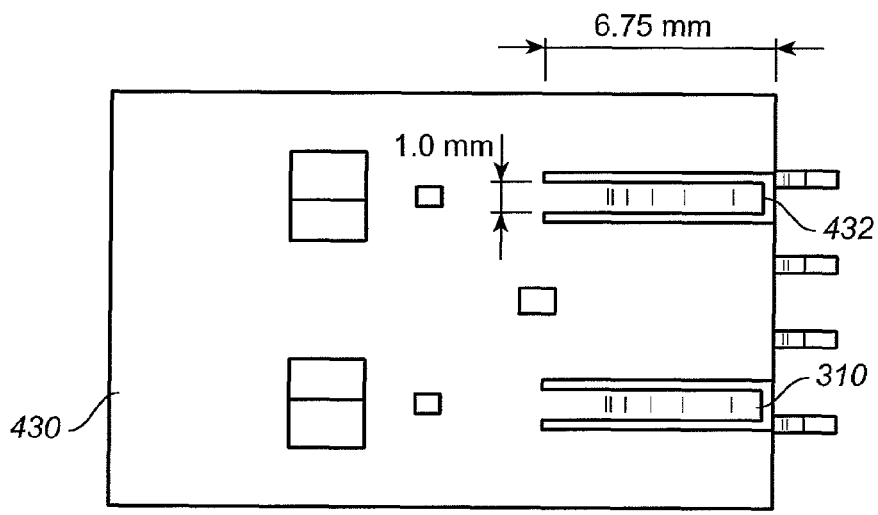
FIG. 4C shows a top-down view of the metal shell of FIG. 4C.

FIG. 4C shows a top-down view of metal shell 430. Springs 310, 432 are shown extending longitudinally 6.75 millimeters and having a width of 1.0 millimeter. Other dimensions may also be used. For example, a single spring having a width of more than one millimeter (1 mm) may also be used and may provide sufficiently low resistance.

In other examples, similar springs may be added to connectors other than USB connectors to provide good connection to a housing or other conductive component which moves with respect to the connector. Examples include connectors provided in various types of memory card and other electronic devices. The present invention is not limited to USB connectors but may also be used with connectors according to different standards. For example, FireWire connectors may be similarly provided with springs where appropriate.

Although the various aspects of the present invention have been described with respect to exemplary embodiments and variations thereof, it will be understood that the invention is entitled to protection within the full scope of the appended claims.

What is claimed is:

1. A method of forming a removable nonvolatile memory comprising:
   forming a memory system on a printed circuit board, the memory system including an array of nonvolatile memory cells and a memory controller;
   attaching a connector to the printed circuit board, the connector having a spring that extends from a top surface of the connector; and
   locating the printed circuit board within an electrically conductive housing such that the spring contacts an inner surface of the electrically conductive housing.

2. The method of claim 1 further comprising discharging static charge on the housing through the spring to the connector along a continuous, electrically conductive low-resistance pathway.

3. The method of claim 1 further comprising connecting the connector to a port, the spring providing an electrically conductive pathway between the housing and the port.

4. The method of claim 1 wherein the printed circuit board has a range of movement within the electrically conductive housing, the range of movement extending from a first position in which the connector is within the housing and a second position in which the connector is at least partially outside the housing.

5. The method of claim 4 wherein the spring maintains contact with the electrically conductive housing in the first position, the second position and at intermediate positions between the first position and the second position.

6. The method of claim 4 wherein the movement from a first position to a second position is along a first direction and the spring exerts a force in a direction perpendicular to the first direction.

7. The method of claim 4 wherein the spring does not exert a force to move the printed circuit board between the first and second positions.

8. The method of claim 5 wherein the connector is a Universal Serial Bus connector.

9. The method of claim 8 wherein the Universal Serial Bus connector includes a metal shell and the spring is integral with the metal shell.

10. The method of claim 9 wherein the connector has at least one additional spring that extends from the connector.

* * * * *

UNITED STATES PATENT AND TRADEMARK OFFICE
CERTIFICATE OF CORRECTION

PATENT NO. : 7,416,419 B2
APPLICATION NO. : 11/465049
DATED : August 26, 2008
INVENTOR(S) : Collantes, Jr.

It is certified that error appears in the above-identified patent and that said Letters Patent is hereby corrected as shown below:

Col. 6, line 25: after "claim" and before "wherein", delete "5" and substitute therefore --1--.

Signed and Sealed this

Tenth Day of February, 2009

JOHN DOLL
*Acting Director of the United States Patent and Trademark Office*